US009202738B2

(12) United States Patent
Greenberg et al.

(10) Patent No.: US 9,202,738 B2
(45) Date of Patent: Dec. 1, 2015

(54) PNEUMATIC END EFFECTOR APPARATUS AND SUBSTRATE TRANSPORTATION SYSTEMS WITH ANNULAR FLOW CHANNEL

(71) Applicant: Applied Materials, Inc., Santa Clara, CA (US)

(72) Inventors: Daniel Greenberg, Santa Clara, CA (US); Ayan Majumdar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/496,088

(22) Filed: Sep. 25, 2014

(65) Prior Publication Data
US 2015/0086316 A1    Mar. 26, 2015

Related U.S. Application Data

(60) Provisional application No. 61/882,787, filed on Sep. 26, 2013.

(51) Int. Cl.
| H01L 21/68 | (2006.01) |
| H01L 21/683 | (2006.01) |
| H01L 21/677 | (2006.01) |
| B25J 15/00 | (2006.01) |
| B25J 15/06 | (2006.01) |
| H01L 21/687 | (2006.01) |

(52) U.S. Cl.
CPC ......... *H01L 21/6838* (2013.01); *B25J 15/0052* (2013.01); *B25J 15/0616* (2013.01); *H01L 21/67766* (2013.01); *H01L 21/68707* (2013.01)

(58) Field of Classification Search
CPC .............. B25J 15/0616; B25J 15/0683; H01L 21/67766; H01L 21/68707
USPC ................... 414/744.8, 941; 294/188; 901/40
See application file for complete search history.

(56) References Cited

U.S. PATENT DOCUMENTS

| 5,789,878 A | 8/1998 | Kroeker et al. |
| 5,879,127 A | 3/1999 | Grunes et al. |
| 6,222,337 B1 | 4/2001 | Kroeker et al. |
| 6,267,549 B1 | 7/2001 | Brown et al. |

(Continued)

FOREIGN PATENT DOCUMENTS

| JP | 2004-186355 | 7/2004 |
| JP | 2007176637 A | * 7/2007 |

(Continued)

OTHER PUBLICATIONS

International Search Report and Written Opinion of International Application No. PCT/US2014/057479 mailed Jan. 7, 2015.

*Primary Examiner* — Gerald McClain
(74) *Attorney, Agent, or Firm* — Dugan & Dugan, PC

(57) ABSTRACT

Systems, apparatus and methods including pneumatic end effectors for transporting substrates between system components of electronic device manufacturing systems are provided. In one aspect, an end effector has a base adapted to be connected to a robotic component, and one or more pneumatic suction elements positioned on the base. Applying a pneumatic source to the pneumatic suction element draws a substrate into contact with contact pads of the end effector. Methods and systems, as well as numerous other aspects are disclosed.

15 Claims, 9 Drawing Sheets

(56) References Cited

U.S. PATENT DOCUMENTS

| | | |
|---|---|---|
| 6,316,367 B1 | 11/2001 | Sumnitsch |
| 6,379,095 B1 | 4/2002 | Elliot et al. |
| 6,513,848 B1 | 2/2003 | Shendon et al. |
| 6,582,175 B2 | 6/2003 | Cox et al. |
| 6,682,113 B2 | 1/2004 | Cox et al. |
| 6,685,422 B2 | 2/2004 | Sundar et al. |
| 6,722,834 B1 | 4/2004 | Tepman |
| 6,817,640 B2 | 11/2004 | Menon et al. |
| 8,267,386 B2 | 9/2012 | Schaaf et al. |
| 8,599,531 B2 | 12/2013 | Sundar et al. |
| 2005/0110292 A1* | 5/2005 | Baumann et al. ............ 294/64.1 |
| 2010/0178137 A1 | 7/2010 | Chintalapati et al. |
| 2010/0178146 A1 | 7/2010 | Kremerman et al. |
| 2010/0178147 A1 | 7/2010 | Kremerman et al. |
| 2011/0160897 A1 | 6/2011 | Shimomura |
| 2013/0039726 A1 | 2/2013 | Brodine et al. |
| 2013/0108409 A1 | 5/2013 | Wu et al. |
| 2013/0115028 A1 | 5/2013 | Kremerman et al. |
| 2013/0149076 A1 | 6/2013 | Cox et al. |

FOREIGN PATENT DOCUMENTS

| | | | |
|---|---|---|---|
| JP | 2007216329 A | * | 8/2007 |
| KR | 20-0404848 | | 12/2005 |
| KR | 10-2008-0068319 | | 7/2008 |

* cited by examiner

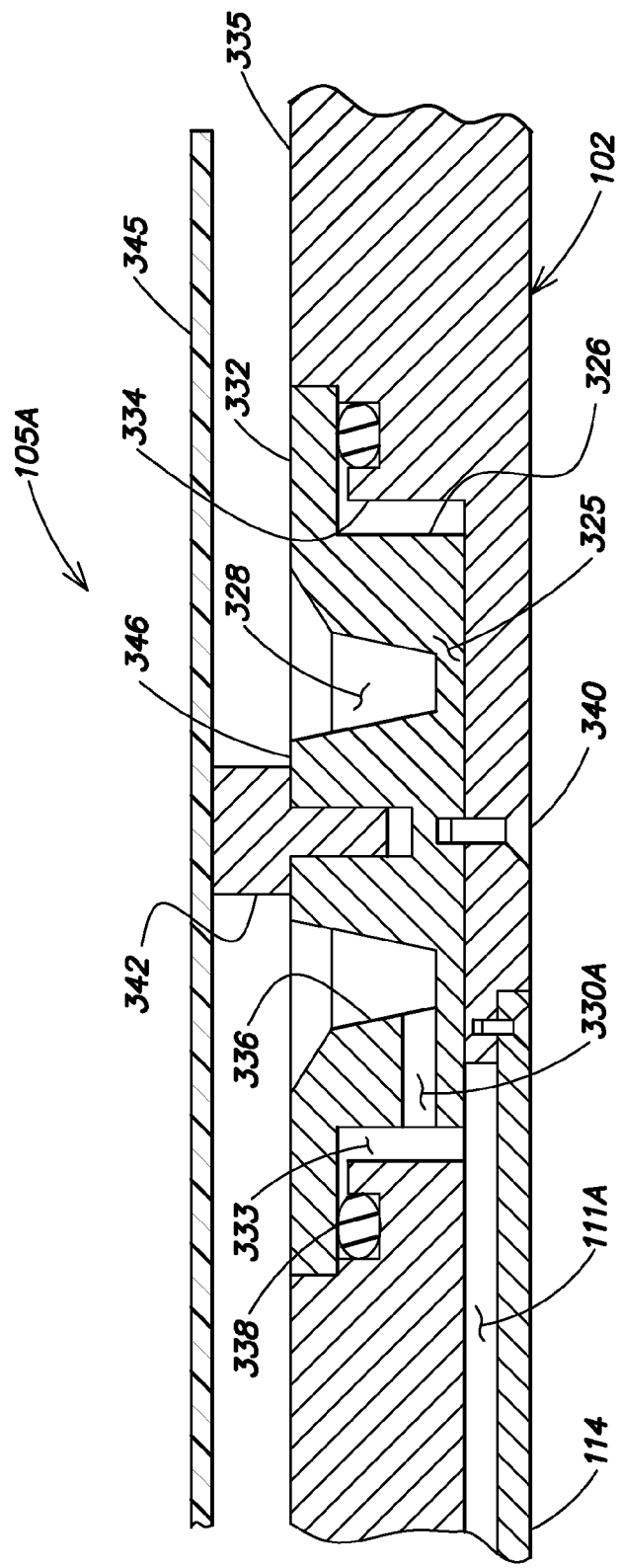

PNEUMATIC END EFFECTOR APPARATUS AND SUBSTRATE TRANSPORTATION SYSTEMS WITH ANNULAR FLOW CHANNEL

RELATED APPLICATIONS

The present application claims priority to U.S. Provisional Application 61/882,787 filed Sep. 26, 2013, and entitled "PNEUMATIC END EFFECTOR APPARATUS, SYSTEMS, AND METHODS FOR TRANSPORTING SUBSTRATES", which is hereby incorporated by reference herein for all purposes.

FIELD

The present invention relates to the manufacture of electronic devices, and more specifically to end effector apparatus, systems, and methods for transporting substrates.

BACKGROUND

In the manufacture of electronic devices, products, and memory articles, precursor articles to such semiconductor wafers (e.g., substrates—both patterned and un-patterned) may be transported between various components of the manufacturing facility and within tools by robot apparatus. For example, transport may be from one process chamber to another within a transfer chamber, from a load lock to a process chamber, from a substrate carrier to a load port in a factory interface of a cluster tool, or the like. During such robotic transport, movement and placement of the substrate with speed and precision is desired. Any slippage of the substrate on the end effector may cause unwanted particles to be generated and may require misalignment correction, which may be time consuming.

Accordingly, efficient systems, apparatus, and methods for transporting substrates in the manufacture of electronic devices are sought after.

SUMMARY

According to a first aspect, an end effector apparatus for transporting a substrate between system components in an electronic device manufacturing system is provided. The end effector apparatus includes a base adapted to be connected to a robotic component, and a pneumatic suction element positioned on the base.

In another aspect, a substrate transportation system for transporting a substrate between electronic device manufacturing system components is provided. The substrate transportation system includes a robotic component, and an end effector coupled to the robotic component, the end effector including a base adapted to be connected to a robotic component, and a pneumatic suction element positioned on the base.

In yet another aspect, a method of transporting a substrate between components of an electronic device manufacturing system is provided. The method includes providing an end effector coupled to a robotic component, the end effector having one or more pneumatic suction elements and three or more contact pads, supporting a substrate on the three or more contact pads, and generating suction via operation of the one or more pneumatic suction elements to draw the substrate into increased contact with the at least three contact pads over that provided by a force of gravity.

Numerous other aspects are provided in accordance with these and other embodiments of the invention. Other features and aspects of embodiments of the present invention will become more fully apparent from the following detailed description, the appended claims, and the accompanying drawings.

BRIEF DESCRIPTION OF THE DRAWINGS

FIG. 3A illustrates a partial cross-sectioned view of a pneumatic suction element of an end effector taken along Section line 3A-3A of FIG. 1.

DESCRIPTION

Figure 1:
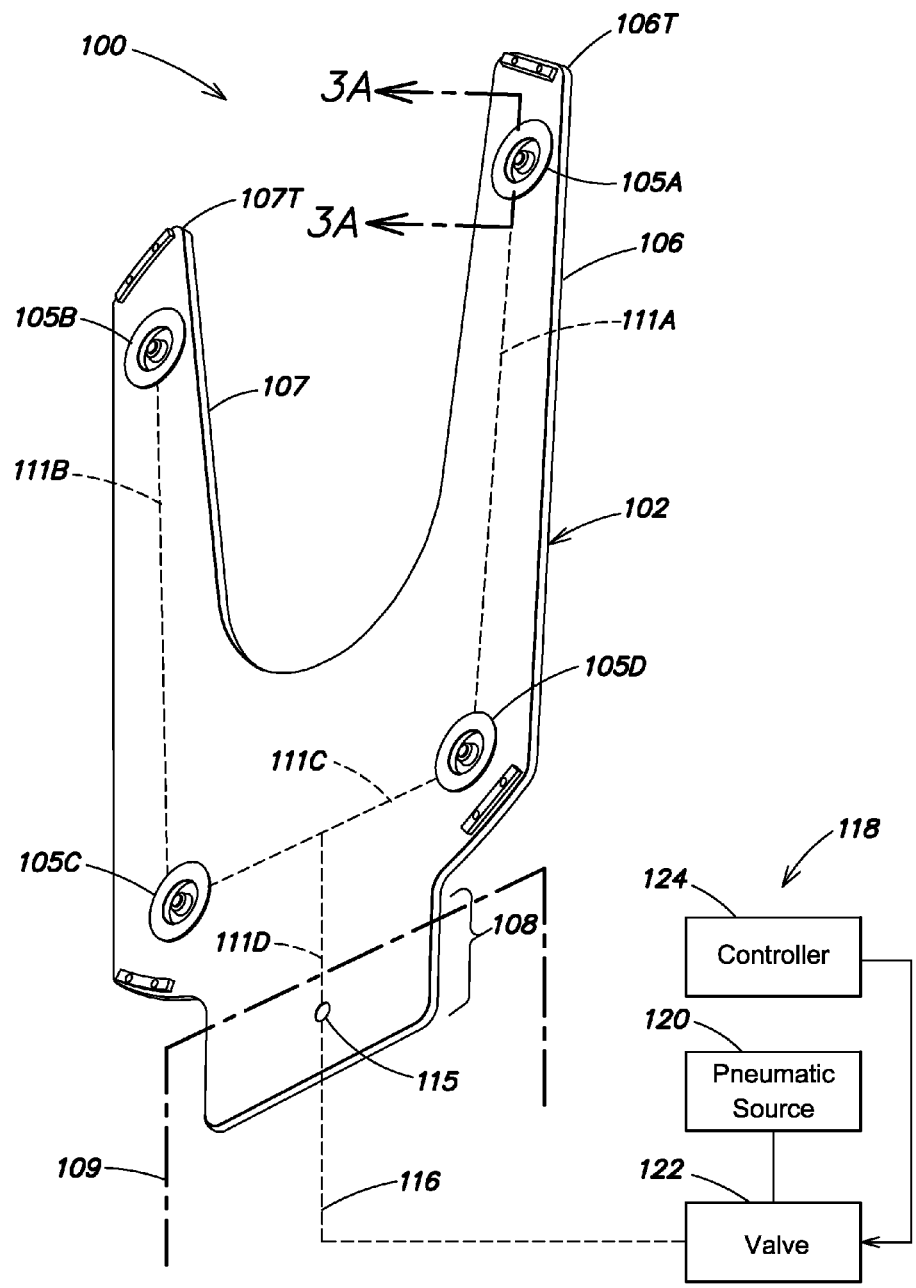
FIG. 1 illustrates a perspective view of an end effector including pneumatic suction elements according to embodiments.

Electronic device manufacturing processes use a variety of precursor articles to produce the final device, such as semiconductor wafers, glass plates, masks (all such precursor articles are herein referred to as a "substrate" or "substrates"). During transport of a substrate from one location to another within the manufacturing process and system, the substrate may be carried by an end effector (sometimes referred to as a "blade"). The substrate rests on the end effector during transport and it may be desirable that slippage between the blade and the substrate be reduced or eliminated. Reducing or eliminating such relative sliding motion between the end effector and the substrate when undergoing lateral motions may reduce positioning errors, reduce repositioning time when sliding actually occurs (e.g., misalignment correction time), and may further reduce particle generation, which may serve to contaminate the tool, other system components, and the substrates.

The inventors herein have discovered that if a suitable downward suction force is provided for clamping or otherwise adhering the substrate to the end effector, then acceleration (e.g., vertical and/or lateral acceleration) of the end effector and secured substrate may be increased. This may translate into increased process throughput, because the substrate may then be moved between various system components more rapidly, potentially leading to lower electronic device manufacturing costs. Furthermore particle generation may be reduced possibly leading to improved process yield. In addition, it may also be desirable that the clamping or adhering mechanism be readily operable and releasable.

In accordance with a first aspect, one or more embodiments of an end effector apparatus may include a base having one or more pneumatic suction elements (and a plurality in the depicted embodiment) thereon. The pneumatic elements may be operable to increase an adherent force attracting the substrate to contact pads of the end effector. Thus, more rapid motions of the end effector and secured substrate may be carried out by using the one or more pneumatic elements.

In accordance with another aspect, a substrate transportation system is provided. The substrate transportation system may include a robotic member, such as a robot wrist, robot arm, and/or a series of robotic components, and an end effector apparatus including one or more pneumatic suction elements coupled to the robotic member. The end effector including one or more pneumatic suction elements may generate suitably high adherent forces (sometimes referred to as "chucking forces") such that slippage between the end effector and substrate may be reduced or eliminated during vertical and/or lateral motions. In some instances, suction forces of greater than 1 pound on the substrate may be achieved.

These and other embodiments of the end effector apparatus including one or more pneumatic suction elements, substrate transportation systems, and methods of transporting a substrate between components of an electronic device manufacturing system, and operating the end effectors and systems are described below with reference to FIGS. 1-6C. Like numerals are used throughout to denote like elements.

FIGS. 1-3B illustrates the end effector 100 and various components thereof according to one or more embodiments of the present invention. The end effector 100 includes a base 102 including a first end adapted to be attached to a robotic component (not shown), and a second end on an end opposite from the first end including a first leg 106 and a second leg 107. The base 102 may be substantially planar, as shown, and may have a thickness of between about 0.118 inches (3 mm) and about 0.157 inches (4 mm), and may be manufactured from a suitable material, such as aluminum, titanium, stainless steel or ceramic, for example. Other materials and dimensions may be used depending on the size of the substrate and the processing temperatures to which the end effector 100 may be exposed.

The base 102 and first and second legs 106, 107 may be as wide as practical to accommodate passing by substrate supports (e.g., lift pins of a process chamber (not shown)), for example. The end effector 100 may attach to the robotic component 109 (e.g., robot wrist shown dotted in FIG. 4 or optionally to a robotic arm) on the first end by any suitable means, such as by fasteners (e.g., bolts, screws, rivets, clamps, quick disconnect, or the like).

Positioned on the base 102 by either mechanical fastening or recessing, may be one or more pneumatic suction elements (e.g., pneumatic suction elements 105A-105D). Four pneumatic suction elements are shown, but as few as one and as many as four or more may be provided, depending on the level of additional adherence force desired. In the depicted end effector 100, a plurality of pneumatic suction elements 105A-105D are positioned on the base 102. The plurality of pneumatic suction elements 105A-105D may be provided at appropriate intervals. For example, in the depicted embodiment, a first pneumatic suction element 105A may be provided on the first leg 106 adjacent to a first leg tip 106T. A second pneumatic suction element 105B may be provided on the second leg 107 adjacent to a second leg tip 107T. A third pneumatic suction element 105C, and even a fourth pneumatic suction element 105D, may be provided on the base 102 adjacent to the connecting portion 108. Connecting portion 108 is adapted to couple to a robotic component 109 (shown dotted). As will be discussed further herein, the end effector 100 is adapted to produce a total downward suction force due to the provided suction of at least 1 lb. (at least 1.1N) to hold a substrate 345 onto the end effector 100 (see FIG. 4). In some experimental embodiments, it was estimated that about 4.3N could be generated by each pneumatic suction element at a flow of approximately 60 psi. Likewise, at a flow of 40 psi, a force of about 0.43 lb. (about 1.9N) may be generated. So using four pneumatic suction elements 105A-105D and operating at 40 psi may possibly generate an adherent force of about 1.7 lb. (about 0.43 lb.×4=1.7 lb. (about 7.5 N)).

Figure 2:
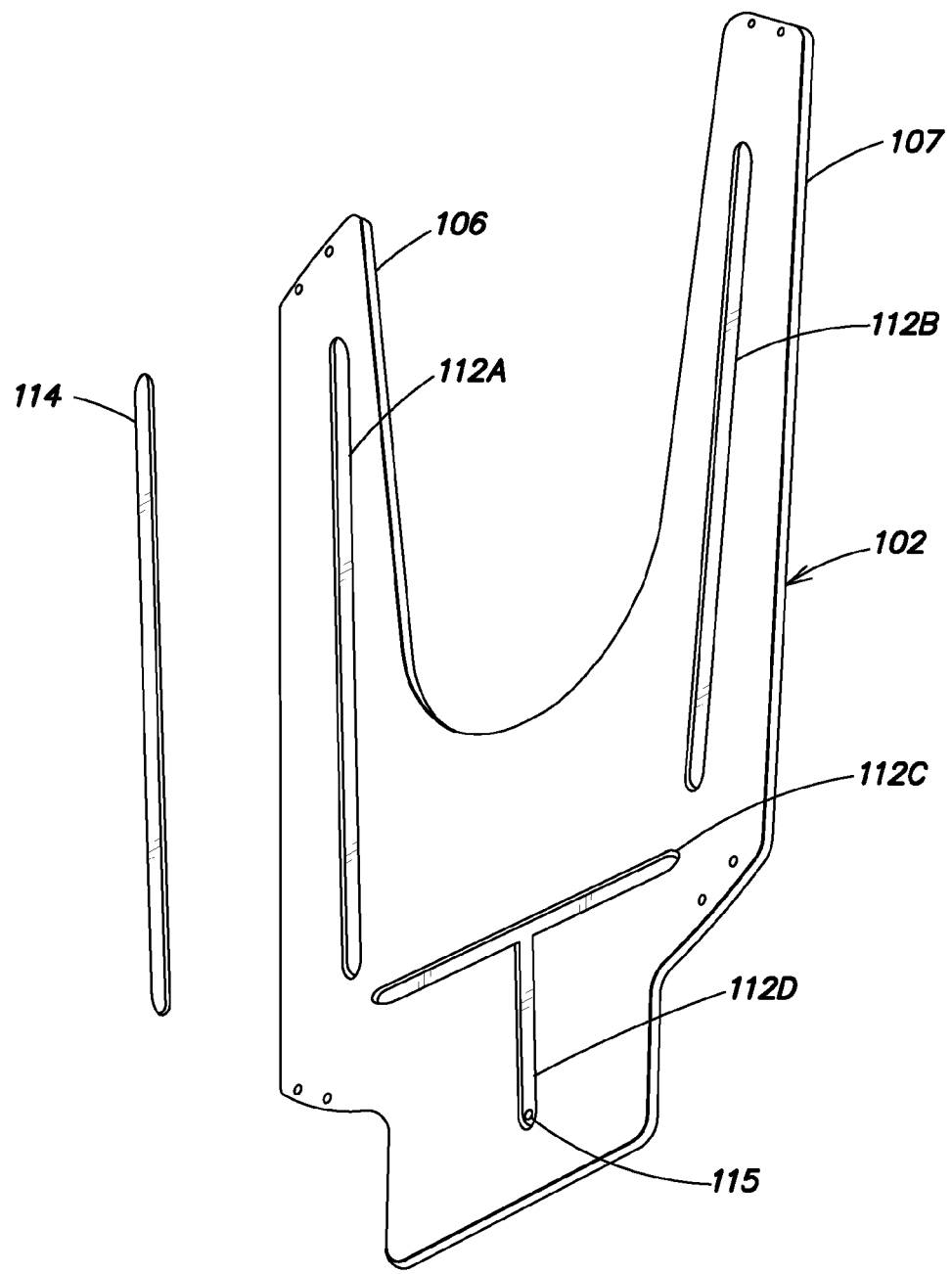
FIG. 2 illustrates a perspective underside view of a portion of an embodiment of an end effector base including exposed pneumatic channels (with covers removed) according to embodiments.

The end effector 100 may include one or more pneumatic passageways (e.g., 111A-111D) formed within the base 102. As depicted, four pneumatic passageways 111A-111D are provided. The pneumatic passageways 111A-111D connect to, and provide pneumatic flow at, the pneumatic suction elements 105A-105D. Passageways 111A-111D may be formed by the assembly of grooves 112A-112D and one or more covers 114 received over the grooves (only one cover 114 shown in FIG. 2). Grooves 112A-112D may formed in an underside of the base 102 as shown in FIG. 2. Thus, the pneumatic passageways 111A-111D may be formed between layers of the base 102. Cover 114 (only one shown) may be received in recessed pockets surrounding the grooves 112A-112D in the base 102 and secured therein. Securing may be by fasteners, braising, adhesive, or the like. Thus, in the depicted embodiment, the pneumatic passageways 111A-111D in the base 102 may be comprised of a first layer having the grooves 112A-112D formed therein and second layer comprising the covers 114. Thus, the pneumatic passageways 111A-111D may be formed between layers, such as between layers of the base 102. Other suitable constructions and conduits for connecting to the pneumatic suction elements 105A-105D may be used.

Pneumatic passageways 111A-111D may extend to, and may interconnect the pneumatic suction elements 105A-105D in some embodiments. Each pneumatic passageway 111A-111D may interconnect to a main connection 115. Main connection 115 may couple to main pneumatic supply channel 116 (shown dotted in FIG. 1), which may connect the pneumatic passageways 111A-111D and thus the pneumatic suction elements 105A-105D to a pneumatic supply system 118. In some embodiments, main pneumatic supply channel 116 may pass through the various arm components of a robot to which the end effector 100 is attached.

Flow through the main pneumatic supply channel 116, and thus a level of suction applied to the substrate by the pneumatic suction elements 105A-105D may be controlled by the pneumatic supply system 118. Pneumatic supply system 118 may include a pneumatic source 120, one or more valves 122, and a controller 124. Pneumatic source 120 may include a pump, reservoir, accumulator, and/or other suitable pneumatic components to supply a flow rate of between about 25 slm and about 90 slm. Other flow rates and means for controlling the gas flow may be employed. Flow may be turned on and off by the pneumatic supply system 118 or the flow rate may be otherwise controlled or adjusted.

Figure 3B:
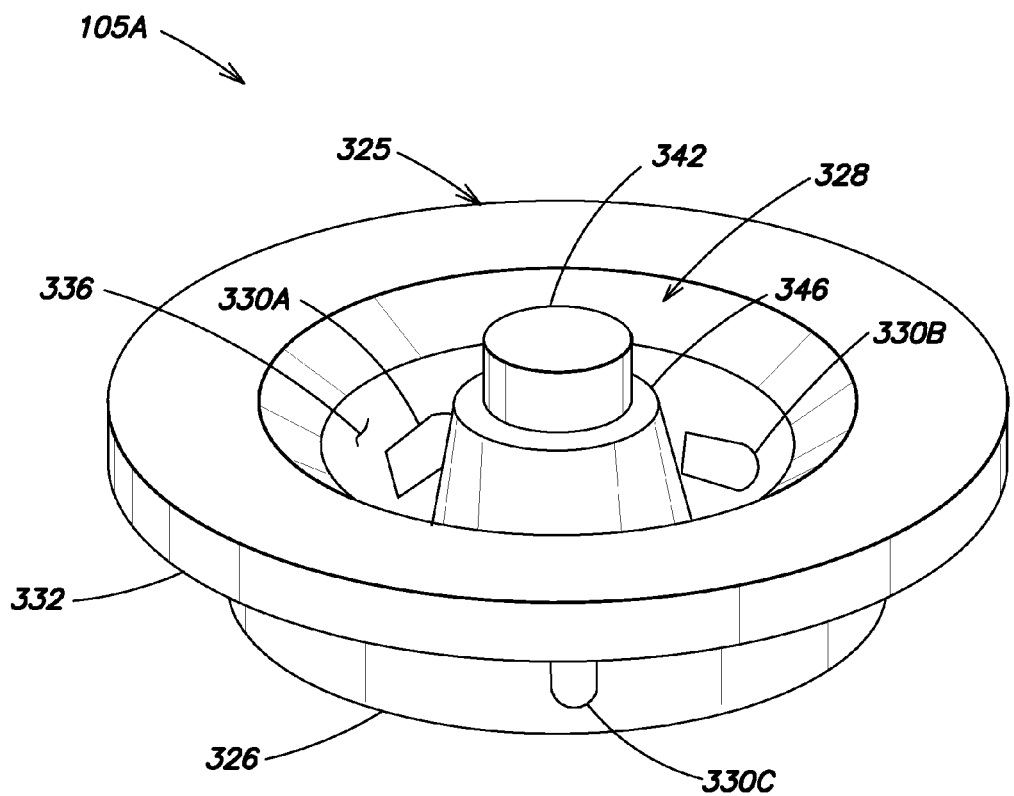
FIG. 3B is a perspective view of a suction element of an end effector apparatus according to embodiments.

Now referring to FIGS. 3A and 3B, the details of the pneumatic suction elements 105A-105D will be described. Each of the pneumatic suction elements 105A-105D may be identical to the pneumatic suction element 105A described herein. As shown, the pneumatic suction element 105A comprises a body 325 adapted to couple to the base 102 and having a pilot portion 326, an inner recessed portion 328, and one or more flow ports 330A-330C intersecting and passing into the inner recessed portion 328. In the depicted embodiment, a flanged portion 332 may also be provided. As shown, pneumatic suction element 105A includes an annular flow channel 333 formed between the body 325 and a cavity 334 formed in the base 102. The annular flow channel 333 interconnects to the pneumatic passage 111A formed in the base 102 and received air flow therefrom. As shown in FIG. 3A, the cover 114 and a main plate 335 of the base 102 may form the pneumatic passage 111A.

In the depicted embodiment, three flow ports 330A-330C are shown. However fewer or more may be used. The flow ports 330A-330C connect between the annular flow channel 333 and the inner recessed portion 328. In particular, the flow ports 330A-330C intersect an outer wall 336 of the inner recessed portion 328. In the depicted embodiment, the one or more flow ports 330A-330C pass into the inner recessed portion 328 and are arranged to project flow at the outer wall 336 of the inner recessed portion 328. For example, the flow ports 330A-330C may be angled so that the flow enters the inner recessed portion 328 in a manner that is tangent to the outer wall 336 of the inner recessed portion 328. In this manner, flow through the flow ports 330A-330C may set up a vortex-like flow pattern traveling circularly around in the inner recessed portion 328.

As shown, the body 325 may be received in the cavity 334 and flanged portion 332 may be provided into sealing contact with seal 338, such as O-ring seal. Fastener 340 may secure the pneumatic suction element 105A to the base 102.

Additionally, the pneumatic suction element 105A may include a contact pad 342 for spacing a substrate 345 (only a portion shown) a suitable distance from the base 102. In the depicted embodiment, the contact pad 342 is coupled to the body 325, such as to a post 346 extending upwardly within the inner recessed portion 328. In the depicted embodiment of FIGS. 1 and 2, the number of contact pads 342 may consist essentially of one contact pad per pneumatic suction element 105A-105D. In other embodiments, the contact pads 342 may be coupled to or integral with the base 102 at appropriate locations, i.e., at different locations than the pneumatic suction elements 105A-105D.

The contact pad 342 may be of any suitable shape (in top view), such as round, oval, square, hexagonal, octagonal or rectangular. Other shapes may be used. In the depicted embodiment, two contact pads 342 may be spaced apart in a lateral direction, such as on first and second legs 106, 107, and at least one more may be elsewhere provided on the base 102. In the depicted embodiment, contact pad 342 may be located substantially on a centerline of the pneumatic suction element 105A. In some embodiments, the contact pads 342 may provide at least a three-point contact with the substrate 345 thereby providing a gap between the substrate 345 and the top surface of the base 102. The gap may be between about 0.5 mm and about 1.5 mm in some embodiments. For example, a gap of less than 0.15 mm, or even less than 0.10 mm, or even less than 0.9 mm may be used. Other gap dimensions may be used.

The contact pad 342 may be secured to the body 325 by any suitable means, such as welding, press fitting, adhering, screwing, bolting, or other mechanical fastening, or the like. The contact pad 342 may have a flat or a domed profile.

Figure 4:
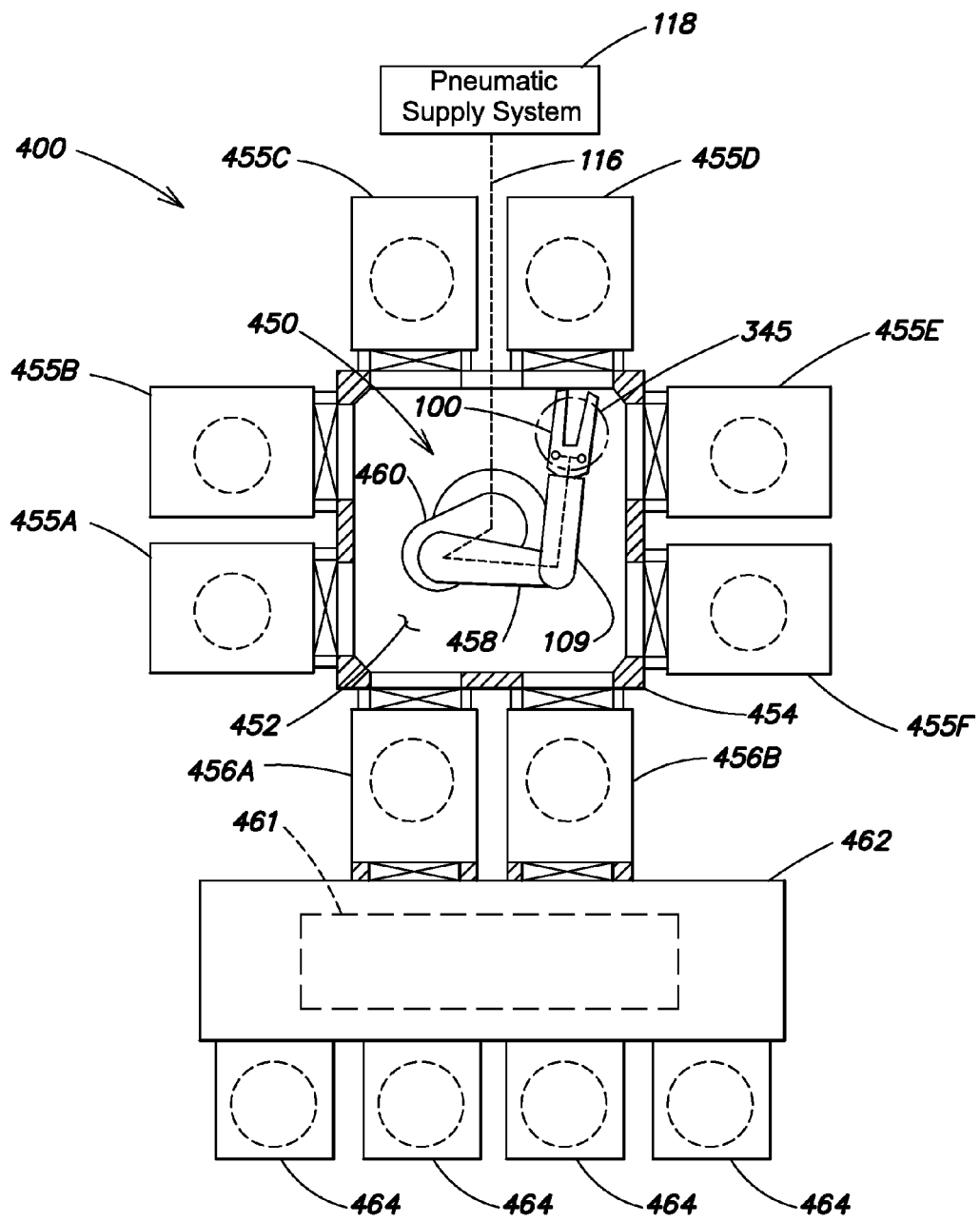
FIG. 4 illustrates a top schematic view of an electronic device processing system including an end effector with one or more pneumatic suction elements according to embodiments.

FIG. 4 illustrates a substrate transportation system 400 adapted for transporting a substrate 345 (shown dotted) between electronic device manufacturing system components. The substrate transportation system 400 includes a robotic component 109, such as a robotic wrist element or other moveable robotic element or arm. In the depicted embodiment, the robotic component 109 may be a component (e.g., robotic wrist member) of a robot 450, which may be provided in a transfer chamber 452 of a mainframe housing 454 in the depicted embodiment. The robot 450 and coupled end effector 100 may be configured and adapted to transport substrates 345 (shown dotted in FIG. 4) to and from various chambers of the cluster tool, such as to and from process chambers 455A-455F, and to and from load lock chambers 456A, 456B, for example. The end effector 100 coupled to the robotic component 109, may be any of the end effectors 100 including one or more pneumatic suction elements 105A-105D described herein.

As shown, the main pneumatic supply channel 116 which may couple to the main connect 115 (FIG. 1) of the end effector 100 may pass through the various components of the robot 450, such as through robotic component 109 and arms 458, 460 and couple to the pneumatic supply system 118.

The robot 450 may be any form of robot, such as a three-link robot, four-link robot, a Selective Compliance Articulated Robot Arm (SCARA) robot, or independently-controllable-arm robot. Other types of robots may be employed. The robot 450 may, for example, include a support base adapted to be mounted to the mainframe housing 454, for example. Optionally, a factory interface robot 461 (shown as a dotted box) including the end effector 100 described herein may be used in a factory interface 462 to transport substrates from substrate carriers 464 coupled to load ports of the factory interface 462 and the load lock chambers 456A, 456B. In some embodiments, the robots 450, 461 may include a vertical (Z-axis) motion capability. Vertical movement of the end effector 100 along the Z-axis may be used to accomplish a placement of the substrate 345 onto a substrate support, such as by placing the substrate 345 onto lift pins in a process chamber (e.g., any one or more of process chambers 455A-455F) or onto slots in a substrate carrier 464 or load lock chamber 456A, 456B, for example. The robots 450, 461 may include any number of robot arms, which may be connected and driven by belts or other transmission components. A robot controller (not shown) may provide suitable control signals to the robots 450, 461 to control the motion of the end effectors 100. The controller 124 (FIG. 1) of the pneumatic supply system 118 may be integral with or otherwise communicate with the robot controller to accomplish transport of the substrate 345.

The end effector 100 may be adapted for use with any suitable robot 450, 461 adapted to transport substrates 345. For example, end effector 100 may be adapted for use with the robots described in U.S. Pat. Nos. 5,789,878; 5,879,127; 6,267,549; 6,379,095; 6,582,175; and 6,722,834; and US Patent Publication Nos. 2010/0178147; 2013/0039726; 2013/0149076; 2013/0115028; and 2010/0178146, for example. Likewise, the end effector 100 may be adapted for use with other types and configurations of process chambers.

Figure 5:
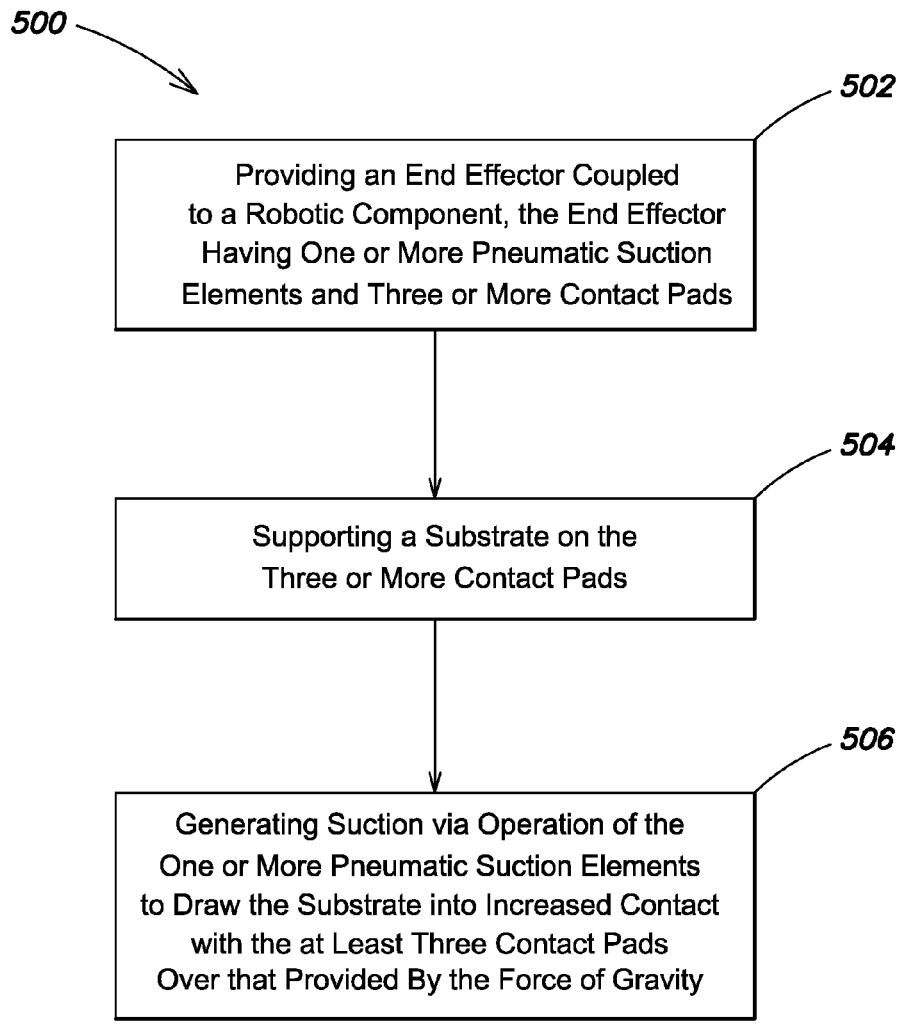
FIG. 5 is a flowchart illustrating a method of transporting a substrate between components of an electronic device manufacturing system according to embodiments.

FIG. 5 illustrates a method 500 of transporting a substrate between components of an electronic device manufacturing system (see FIG. 4). The method 500 includes, in 502, providing an end effector (e.g., end effector 100) coupled to a robotic component (e.g., robotic component 109, such as a wrist member or other robotic component), the end effector having one or more pneumatic suction elements (e.g., pneumatic suction element 105A, 105B, 105C, and/or 105D) and three or more contact pads (e.g., contact pad 342).

The method 500 further includes, in 504, supporting a substrate (e.g., substrate 345) on the three or more contact pads, and, in 506, generating a suction via operation of the one or more pneumatic suction element to draw the substrate into increased contact with the at least three contact pads over that provided by the force of gravity. The additional down force provided by suction may be 1 lb. (about 4.45 N) or more over that provided by the force of gravity.

Figure 6A:
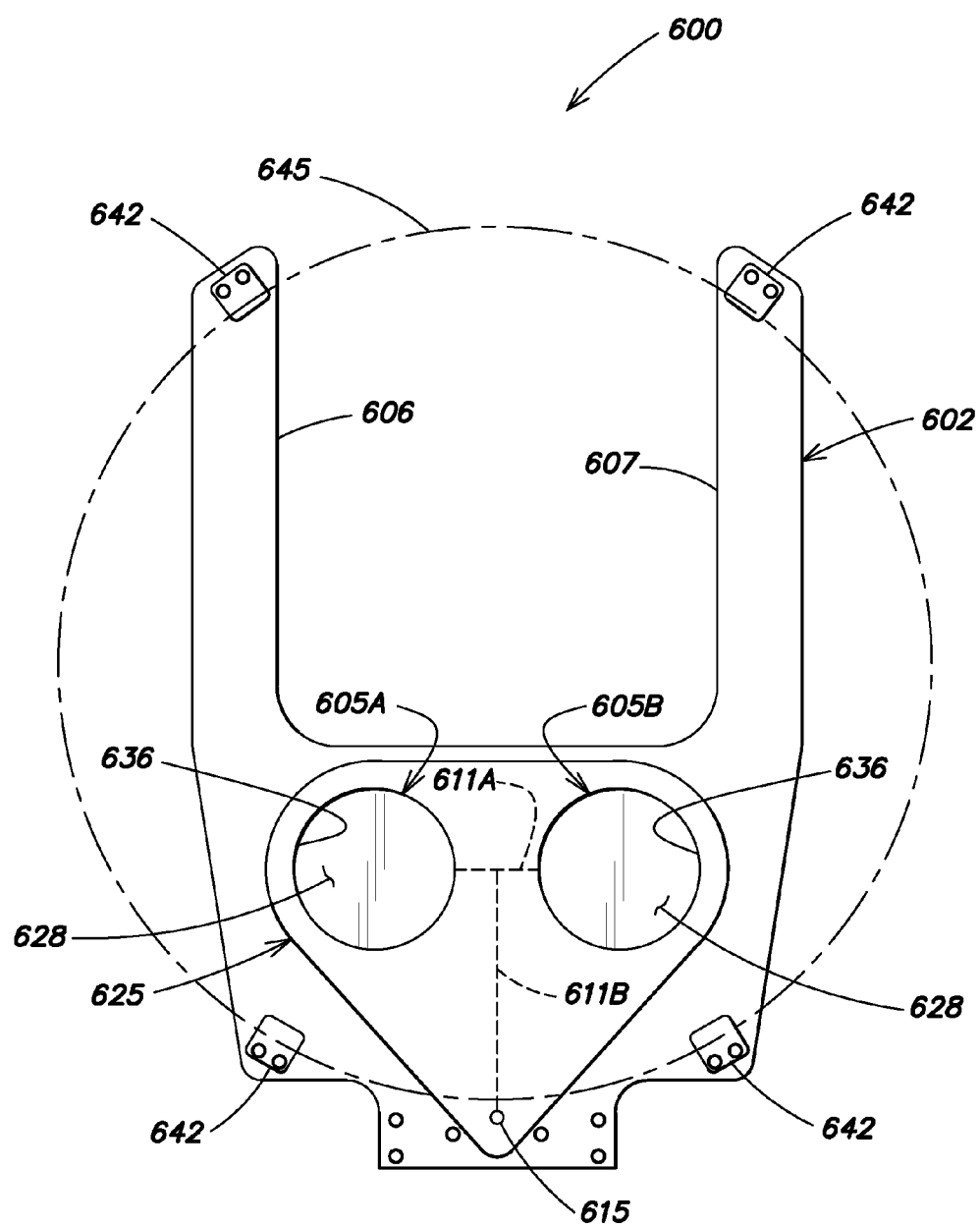
FIGS. 6A-6C illustrates various assembly and component views of another end effector with one or more pneumatic suction elements according to embodiments.
Figure 6B:
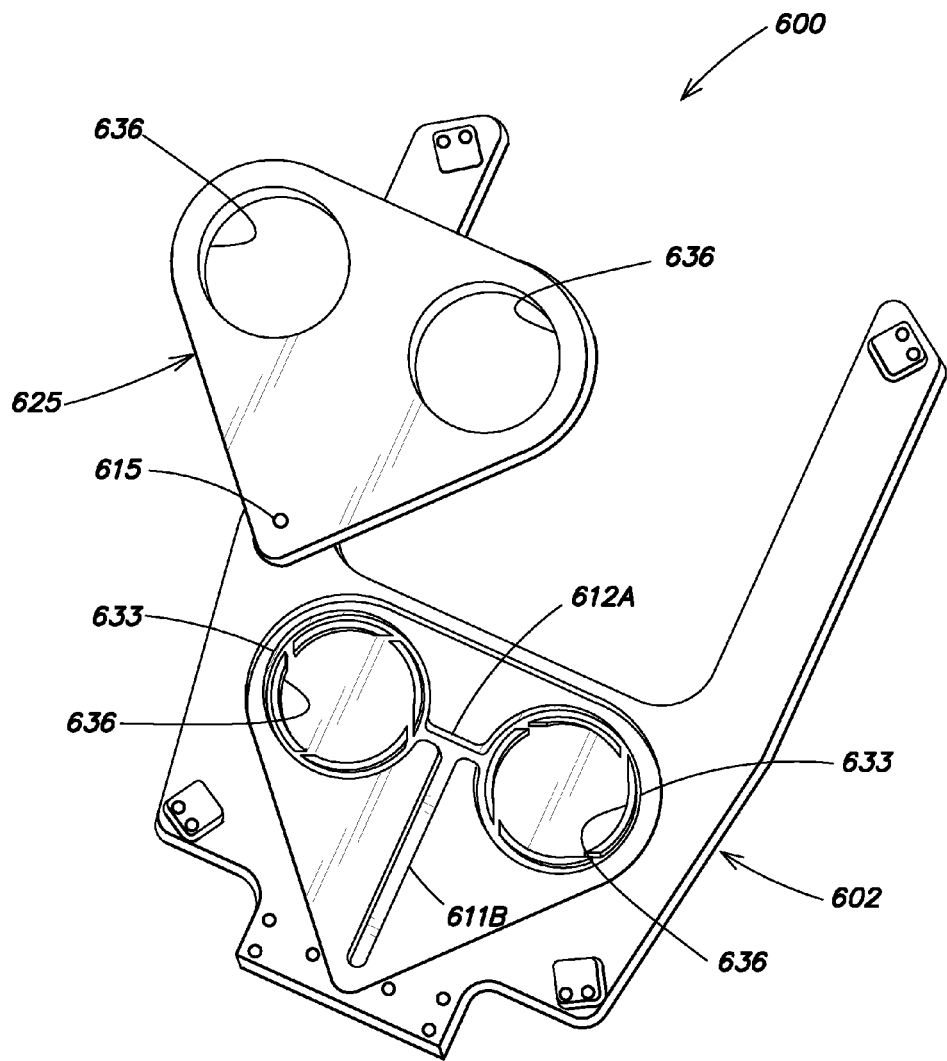
Figure 6C:
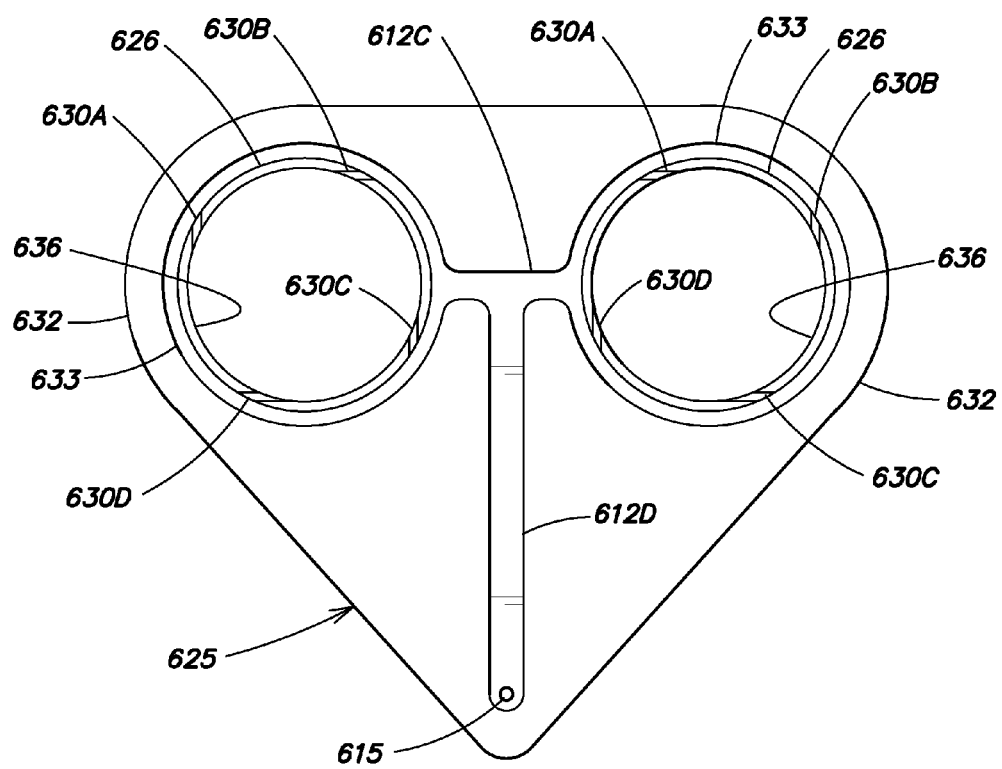

FIGS. 6A-6C illustrates another embodiment of end effector 600 and various components thereof. The end effector 600 includes a base 602 including a first end adapted to be attached to a robotic component (not shown), and a second end on an end opposite from the first end including a first leg 606 and a second leg 607. The base 602 may be substantially planar, as shown, and may have a thickness and be made of a material as was discussed above.

The end effector 100 may attach to the robotic component 109 (e.g., robot wrist such as shown in FIG. 4 or to a robotic arm) by any suitable means, such as by fasteners (e.g., bolts, screws, rivets, clamps, quick disconnect, or the like).

Positioned on the base 602 by either mechanical fastening, braising, or recessing, may be one or more pneumatic suction elements. Two pneumatic suction elements 605A, 605B are shown, but as few as one and as many as four or more may be provided, depending on the level of additional adherence (e.g., suction) force desired over that provided by the force of gravity. In the depicted end effector 600, the pneumatic suction elements 605A, 605B are positioned on the base 602. The pneumatic suction elements 605A, 605B may be provided on the base 602 at other than on the legs 606, 607.

The end effector 600 may include one or more pneumatic passageways (e.g., 611A, 611B) formed therein. As depicted, the pneumatic passageways 611A, 611B provide pneumatic flow at the pneumatic suction elements 605A, 605B. Passageways 611A, 611B may be formed by an assembly of grooves 612A, 612B formed in the base 602 and grooves 612C, 612D formed in the body 625. Thus, the pneumatic passageways 611A, 611B may be formed between layers of the base 602 and the body 625. Body 625 may be received in recessed pockets formed in the base 602. Securing may be by fasteners or adhesive, or the like.

Pneumatic passageways 611A, 611B may extend to, and may interconnect the pneumatic suction elements 605A, 605B in some embodiments. Each pneumatic passageway 611A, 611B may interconnect to a main connection 615. Main connection 615 may couple to main pneumatic supply channel, such as main pneumatic supply channel 116 shown in FIG. 1.

Again referring to FIGS. 6A-6C, the details of the pneumatic suction elements 605A, 605B will be described. Each of the pneumatic suction elements 605A, 605B may be identical, but mirror images. As shown, the pneumatic suction elements 605A, 605B comprise the body 625 adapted to couple to the base 602. The body 625 and the base 602 form a pilot portion 626, an inner recessed portion 628, and one or more flow ports 630A-630D intersecting and passing into the inner recessed portion 628.

In the depicted embodiment, a flanged portion 632 is also provided. As shown, pneumatic suction elements 605A, 605B each include an annular flow channel 633 formed between the body 625 and the base 602, wherein the annular flow channels 633 interconnect the pneumatic passageways 611A, 611B.

In the depicted embodiment, four flow ports 630A-630D are shown. However fewer or more may be used. The flow ports 630A-630D connect and provide a flow port between the annular flow channel 633 and the inner recessed portion 628. In particular, the flow ports 630A-630D intersect an outer wall 636 of the inner recessed portion 628. In the depicted embodiment, the one or more flow ports 630A-630D pass into the inner recessed portion 628 and are arranged to project gas flow at the outer wall 636 of the inner recessed portion 628. For example, the flow ports 630A-630D may be angled so that the gas flow enters into the inner recessed portion 628 in a manner that is substantially tangent to the outer wall 636 of the inner recessed portion 328. In this manner, flow through the flow ports 630A-630D may set up a vortex-like gas flow pattern in the inner recessed portion 628 which produces down force on the substrate 645 (shown dotted in FIG. 6A).

As shown, the body 625 may be received in a cavity of the base 602 and may be in sealed contact with the body, such as by welding, braising, adhesive, fasteners or the like.

Additionally, the base 602 may include contact pads 642 for spacing a substrate 645 a suitable distance from the base 602. A number of contact pads 642 may comprise three or more and may be coupled to or integral with the base 602 at appropriate locations.

The contact pad 642 may be of any suitable shape (in top view), such as round, oval, square, hexagonal, octagonal or rectangular. Other shapes may be used. Preferably, two contact pads 642 may be spaced apart in a lateral direction, such as on legs 606, 607, and at least one more may be elsewhere provided on the base 602. In the depicted embodiment, the contact pads 642 provide at least a three-point contact with the substrate 645 thereby providing a gap between the substrate 645 and the top surface of the base 602. The gap may be between about 0.5 mm and about 1.5 mm in some embodiments. For example, a gap of less than 0.15 mm, or even less than 0.10 mm, or even less than 0.9 mm may be used. Other gap dimensions may be used. The contact pad 342 may have a flat or a domed profile.

The foregoing description discloses only example embodiments of the invention. Modifications of the above-disclosed systems, apparatus, and methods which fall within the scope of the invention will be readily apparent to those of ordinary skill in the art. Accordingly, while the present invention has been disclosed in connection with several embodiments thereof, it should be understood that other embodiments may fall within the scope of the invention as defined by the following claims.

The invention claimed is:

1. An end effector apparatus, comprising:
a base adapted to be connected to a robotic component; and
a pneumatic suction element positioned on the base, the pneumatic suction element comprising a body coupled to the base, an inner recessed portion, an annular flow channel comprising an annulus surrounding the inner recessed portion and being disposed between the body and the base, a pilot portion between the annular flow channel and the inner recessed portion, and one or more flow ports connected between the annular flow channel and the inner recessed portion and passing through the pilot portion.

2. The end effector apparatus of claim 1, comprising a plurality of pneumatic suction elements positioned on the base wherein two pneumatic suction elements are formed by the body and the base.

3. The end effector apparatus of claim 1, wherein the end effector is adapted to produce a total suction force of at least 1 lb.

4. The end effector apparatus of claim 1, wherein the base further comprises a first leg and a second leg.

5. The end effector apparatus of claim 1, wherein the base comprises a first layer and second layer.

6. The end effector apparatus of claim 1, comprising pneumatic passageways formed at least partially within the base.

7. The end effector apparatus of claim 6, wherein the pneumatic passageways are formed between layers.

8. The end effector apparatus of claim 1, wherein the base further comprises a first layer and a second layer, and at least one pneumatic passageway is formed between the layers and extends to the pneumatic suction element.

9. The end effector apparatus of claim 1, wherein the pneumatic suction element comprises a body adapted to couple to the base and a contact pad coupled to the body.

10. The end effector apparatus of claim 1, wherein the pneumatic suction element comprises a body adapted to couple to the base, and an annular flow channel comprising an annulus formed between the body and the base wherein the annular flow channel interconnects with a pneumatic passage.

11. The end effector apparatus of claim 1 wherein the one or more flow ports pass into the inner recessed portion substantially tangent to an outer wall of the inner recessed portion.

12. A substrate transportation system for transporting a substrate between electronic device manufacturing system components, comprising:
- a robotic component; and
- an end effector coupled to the robotic component, the end effector including
  - a base adapted to be connected to a robotic component, and
  - a pneumatic suction element positioned on the base, the pneumatic suction element comprising a body coupled to the base, an inner recessed portion, an annular flow channel comprising an annulus surrounding the inner recessed portion and being disposed between the body and the base, a pilot portion between the annular flow channel and the inner recessed portion, and one or more flow ports connected between the annular flow channel and the inner recessed portion and passing through the pilot portion.

13. The substrate transportation system of claim 12, comprising one or more a pneumatic passageways at least partially formed in the base.

14. The substrate transportation system of claim 13, comprising a pneumatic supply system coupled to the one or more pneumatic passageways.

15. The substrate transportation system of claim 12, comprising the pneumatic suction element, and at least one other pneumatic suction element positioned on the base.

* * * * *